US012692622B2

(12) United States Patent
Yen et al.

(10) Patent No.: US 12,692,622 B2
(45) Date of Patent: Jul. 28, 2026

(54) SEMICONDUCTOR STRUCTURE AND MANUFACTURING METHOD THEREOF

(71) Applicant: Hon Young Semiconductor Corporation, Hsinchu City (TW)

(72) Inventors: Hung-Hsin Yen, Hsinchu City (TW); Chin-Hung Chen, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 171 days.

(21) Appl. No.: 18/651,706

(22) Filed: May 1, 2024

(65) Prior Publication Data

US 2025/0290226 A1     Sep. 18, 2025

(30) Foreign Application Priority Data

Mar. 13, 2024     (TW) ................................. 113109323

(51) Int. Cl.
| | |
|---|---|
| *C30B 25/16* | (2006.01) |
| *C30B 25/18* | (2006.01) |
| *C30B 25/20* | (2006.01) |
| *C30B 29/36* | (2006.01) |
| *H10D 62/832* | (2025.01) |

(52) U.S. Cl.
CPC .......... *C30B 25/165* (2013.01); *C30B 25/183* (2013.01); *C30B 25/20* (2013.01); *C30B 29/36* (2013.01); *H10D 62/8325* (2025.01)

(58) Field of Classification Search
None
See application file for complete search history.

(56) References Cited

U.S. PATENT DOCUMENTS

| | | | |
|---|---|---|---|
| 10,167,549 B2 | 1/2019 | Nakamura et al. | |
| 2022/0367661 A1* | 11/2022 | Yoon ...................... | H10D 64/01 |

FOREIGN PATENT DOCUMENTS

| | | | | |
|---|---|---|---|---|
| CN | 106711031 A | * | 5/2017 | ......... H10D 64/0134 |
| CN | 116613056 B | | 10/2023 | |
| CN | 116892059 A | | 10/2023 | |
| TW | 201318029 A | | 5/2013 | |
| TW | 201539651 A | | 10/2015 | |

OTHER PUBLICATIONS

Li, CN-106711031-A, May 24, 2017 (machine translation) (Year: 2017).*

* cited by examiner

*Primary Examiner* — Cheng Yuan Huang
(74) *Attorney, Agent, or Firm* — CKC & Partners Co., LLC

(57) ABSTRACT

A semiconductor structure includes a silicon carbide substrate, a silicon carbide buffer layer, and an epitaxial layer. The silicon carbide buffer layer is disposed on the silicon carbide substrate. The epitaxial layer is disposed on the silicon carbide buffer layer, in which a molar ratio of carbon to silicon atoms in the silicon carbide buffer layer gradually increases along a direction from the silicon carbide substrate to the epitaxial layer.

4 Claims, 2 Drawing Sheets

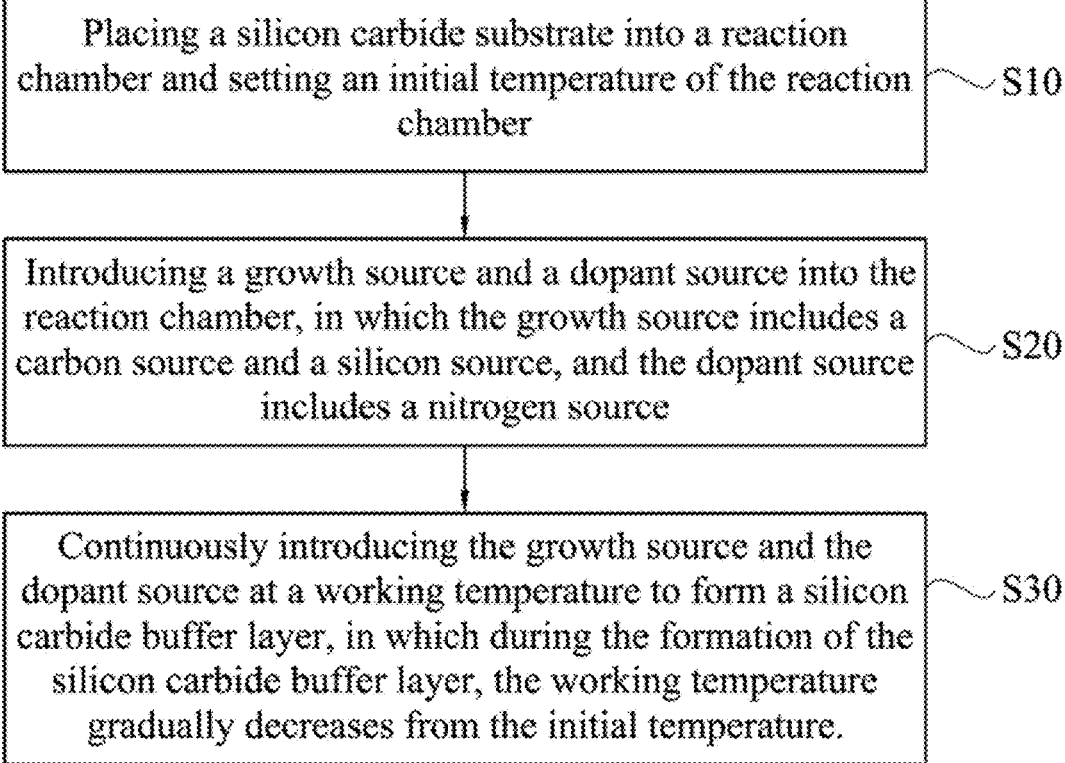

Placing a silicon carbide substrate into a reaction chamber and setting an initial temperature of the reaction chamber ~S10

Introducing a growth source and a dopant source into the reaction chamber, in which the growth source includes a carbon source and a silicon source, and the dopant source includes a nitrogen source ~S20

Continuously introducing the growth source and the dopant source at a working temperature to form a silicon carbide buffer layer, in which during the formation of the silicon carbide buffer layer, the working temperature gradually decreases from the initial temperature. ~S30

Fig. 2

SEMICONDUCTOR STRUCTURE AND MANUFACTURING METHOD THEREOF

CROSS-REFERENCE TO RELATED APPLICATION

This application claims priority to Taiwan Application Serial Number 113109323, filed Mar. 13, 2024, which is herein incorporated by reference.

BACKGROUND

Field of Disclosure

The present disclosure relates to a semiconductor structure and a manufacturing method thereof.

Description of Related Art

Silicon carbide (SiC) is a special semiconductor material with characteristics such as wide bandgap, high critical breakdown electric field, high thermal conductivity, and high saturation of carrier's drift velocity, making it suitable for manufacturing semiconductor devices for high temperature, high voltage, high power, and radiation resistance applications. Although silicon carbide material has many advantages, it often contains a large number of defects, such as basal plane dislocations (BPD). These defects can further extend from the substrate to the epitaxial layer, leading to increased reverse leakage current or reduced breakdown voltage of semiconductor devices, resulting in reduced reliability of semiconductor devices. Compared to BPD, the impact of threading edge dislocations (TED) on the performance of semiconductor devices is smaller. Therefore, how to increase the proportion of BPD converted to TED during silicon carbide epitaxial growth and prevent BPD in the substrate from extending into the epitaxial layer is essential for improving the performance of semiconductor devices.

SUMMARY

According to some embodiments of the present disclosure, a semiconductor structure includes a silicon carbide substrate, a silicon carbide buffer layer, and an epitaxial layer. The silicon carbide buffer layer is disposed on the silicon carbide substrate. The epitaxial layer is disposed on the silicon carbide buffer layer, in which a molar ratio of carbon to silicon atoms in the silicon carbide buffer layer gradually increases along a direction from the silicon carbide substrate to the epitaxial layer.

According to some embodiments of the present disclosure, a manufacturing method of a semiconductor structure includes: placing a silicon carbide substrate into a reaction chamber and setting an initial temperature of the reaction chamber; introducing a growth source and a dopant source into the reaction chamber, in which the growth source includes a carbon source and a silicon source, and the dopant source includes a nitrogen source; and continuously introducing the growth source and the dopant source at a working temperature to form a silicon carbide buffer layer, in which during the formation of the silicon carbide buffer layer, the working temperature gradually decreases from the initial temperature.

According to some embodiments of the present disclosure, a manufacturing method of a semiconductor structure includes: forming a first silicon carbide buffer layer on a silicon carbide substrate at a first temperature; and forming a second silicon carbide buffer layer on the first silicon carbide buffer layer at a second temperature, in which the second temperature is less than the first temperature.

According to the aforementioned embodiments of the present disclosure, by forming a silicon carbide buffer layer with a gradient variation in the molar ratio of carbon to silicon atoms (C/Si Ratio) before forming the epitaxial layer, the efficiency of converting BPD to TED during subsequent silicon carbide epitaxial growth can be increased, thereby improving epitaxial quality.

BRIEF DESCRIPTION OF THE DRAWINGS

The disclosure can be more fully understood by reading the following detailed description of the embodiments, with reference made to the accompanying drawings as follows:

FIG. 2 is a flowchart of a manufacturing method of a semiconductor structure according to some embodiments of the present disclosure.

DETAILED DESCRIPTION

Figure 1:
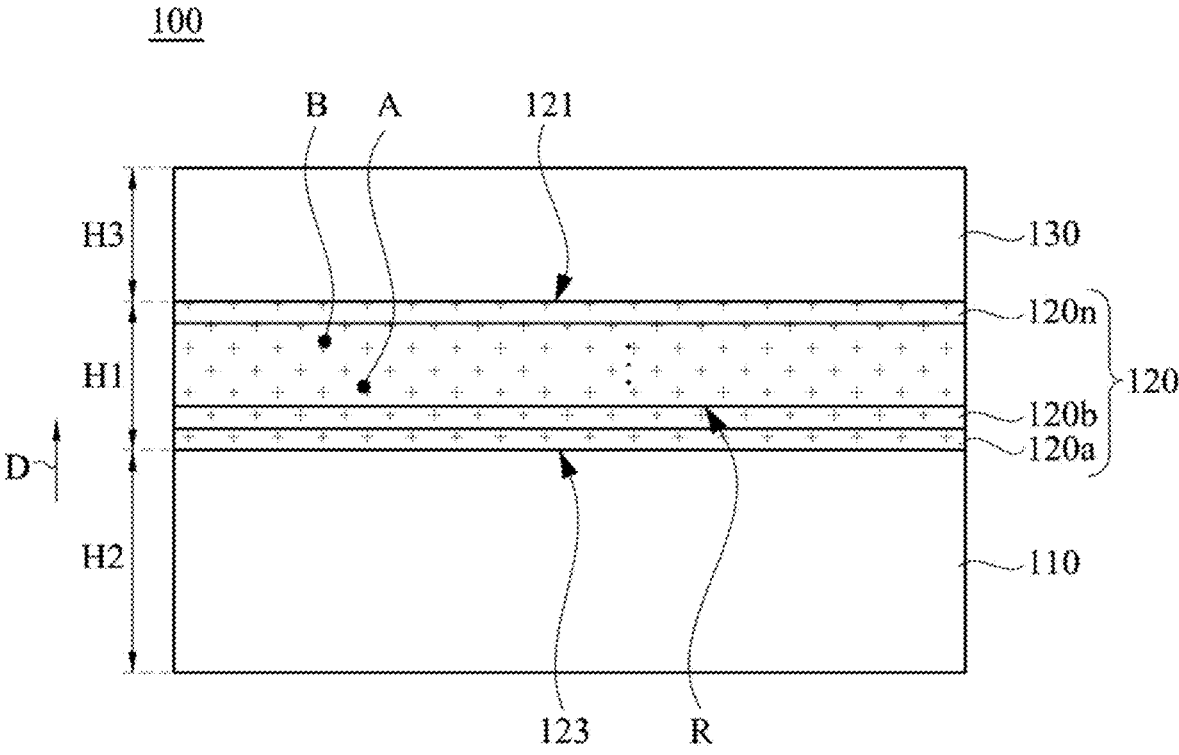
FIG. 1 is a schematic side view of a semiconductor structure according to some embodiments of the present disclosure.

The present disclosure relates to a method for improving the reliability of semiconductor structures. Specifically, the silicon carbide (SiC) buffer layer is modified in a gradient manner such that the molar ratio of carbon to silicon atoms (the carbon-to-silicon ratio, C/Si Ratio) gradually increases along its stack thickness, thereby improving the conversion efficiency of basal plane dislocations (BPD) into threading edge dislocations (TED) during subsequent SiC epitaxial growth. This reduces the probability of the formation of killer defect and improve epitaxial quality. Additionally, by gradually decreasing the doping concentration of the SiC buffer layer along its stack thickness, the probability of generating large defects (such as triangular defects and carrot defects) during subsequent SiC epitaxial growth can be reduced. Consequently, the semiconductor structure disclosed herein can meet the performance and reliability requirements of high-voltage and high-current electronic devices.

Please refer to FIG. 1, which is a schematic side view of a semiconductor structure 100 according to some embodiments of the present disclosure. Specifically, semiconductor structure 100 includes a SiC substrate 110, a SiC buffer layer 120, and an epitaxial layer 130. The SiC buffer layer 120 is disposed on the SiC substrate 110, and the epitaxial layer 130 is disposed on the SiC buffer layer 120. In other words, the SiC buffer layer 120 and the epitaxial layer 130 are sequentially disposed on the SiC substrate 110. In other words, the SiC buffer layer 120 has a first surface 121 and a second surface 123 facing away from the first surface 121, and the epitaxial layer 130 and the SiC substrate 110 are respectively disposed on the first surface 121 and the second surface 123 of the SiC buffer layer 120. It should be noted that the SiC substrate 110 disclosed herein has a 4H-SiC crystal structure, and homogeneous epitaxy of 4H-SiC is expected. Furthermore, the semiconductor structure 100 disclosed herein is an N-type semiconductor structure.

For clarity and ease of explanation, the manufacturing method of the semiconductor structure 100 will be described firstly in the following description, and the structural features of the semiconductor structure 100 of the present disclosure will be presented through the manufacturing method. Please refer to FIG. 2, which is a flowchart of a manufacturing method of a semiconductor structure 100 according to some embodiments of the present disclosure. Specifically, the manufacturing method of the semiconductor structure 100 includes steps S10 to S30, which may be performed sequentially. Upon completion of step S30, the SiC buffer layer 120 on the SiC substrate 110 can be obtained.

In some embodiments, an etching process may be performed on the SiC substrate 110 before forming the SiC buffer layer 120. Specifically, the SiC substrate 110 can be placed in a reaction chamber (not shown in the figure), and the chamber gas can be replaced several times with argon gas. Subsequently, hydrogen gas is introduced into the reaction chamber, and the flow rate of hydrogen gas is gradually increased to 250 standard liters per minute to 350 standard liters per minute, and the temperature of the reaction chamber is gradually increased to 1400° C. to 1600° C. After reaching the set temperature, in-situ hydrogen etching of the SiC substrate 110 is performed for 5 minutes to 20 minutes. By etching the SiC substrate 110 in advance under a high-temperature condition, not only can dust particles on the surface of the SiC substrate 110 be removed, but also the effective suppression of 2D island nucleation can be achieved in the early stage of epitaxy, thereby effectively preventing the formation of unexpected 3C—SiC crystal structures.

In some embodiments, the step of etching process may be optionally omitted, and the SiC buffer layer 120 can be directly prepared. Specifically, after placing the SiC substrate 110 into the reaction chamber, the initial temperature Ti of the reaction chamber can be directly set to prepare for the formation of the SiC buffer layer 120, in which the initial temperature Ti can range from 1620° C. to 1680° C. This step is denoted as step S10 in the present disclosure.

Subsequently, step S20 is performed. At the initial temperature Ti, while maintaining the introduction of hydrogen gas, a growth source and a doping source are introduced into the reaction chamber. The growth source includes a carbon source and a silicon source, and the doping source includes a nitrogen source. In some embodiments, the carbon source may include propane, ethylene, or a combination thereof, the silicon source may include silane, dichlorosilane, trichlorosilane, or combinations thereof, and the nitrogen source may include nitrogen, ammonia, or combinations thereof.

Subsequently, step S30 is carried out. At the working temperature Tw, the growth source and doping source are continuously introduced to form the SiC buffer layer 120 epitaxially, in which during the formation of the SiC buffer layer 120, the working temperature Tw is gradually decreased from the initial temperature Ti. Specifically, after step S20, the temperature of the reaction chamber remains at the initial temperature Ti set in the step S10, and hydrogen gas, growth source, and doping source are continuously introduced into the reaction chamber for a period of time to epitaxially grow a first SiC buffer layer 120a, which contains dopants (nitrogen), from the SiC substrate 110. In other words, during the initial formation of the SiC buffer layer 120, the working temperature Tw used is the initial temperature Ti set in the step S10. Subsequently, the working temperature Tw is gradually decreased, and hydrogen gas, growth source, and doping source continue to be introduced into the reaction chamber, thereby continuously epitaxially growing a second SiC buffer layer 120b containing dopants on the already grown first SiC buffer layer 120a, and so on, until the nth SiC buffer layer 120n.

It should be noted that although FIG. 1 depicts the SiC buffer layer 120 as being neatly stacked from the first SiC buffer layer 120a to the nth SiC buffer layer 120n, this depiction is only for the convenience of explaining the epitaxial process and the structural characteristics generated after epitaxy. More specifically, since the SiC buffer layer 120 is formed through continuous epitaxial growth, the SiC buffer layer 120 is a continuous structure without distinct interfaces R therein. However, due to process factors, the SiC buffer layer 120 still exhibits gradient variations in structural characteristic. Therefore, the SiC buffer layer 120 can still be decomposed into the first SiC buffer layer 120a, . . . , and the nth SiC buffer layer 120n with different structural characteristics shown in FIG. 1 based on the structural characteristic variations of the SiC buffer layer 120.

Since the SiC buffer layer 120 is formed by epitaxy, and lower epitaxial temperatures can result in a higher C/Si Ratio in the formed SiC buffer layer 120, forming the SiC buffer layer 120 by gradually lowering the temperature can result in the later-formed SiC buffer layers (e.g., the nth SiC buffer layer 120n) located at higher levels (i.e., further away from the SiC substrate 110) having a higher C/Si Ratio. In other words, compared to the bottom position of the SiC buffer layer 120 (i.e., closer to the SiC substrate 110), the top position of the SiC buffer layer 120 (i.e., further away from the SiC substrate 110) has a higher C/Si Ratio. With this design, lateral growth at the top position of the SiC buffer layer 120 is promoted while step flow growth at the top position of the SiC buffer layer 120 is inhibited. Consequently, when the SiC buffer layer 120 further epitaxially grows upwards to form the epitaxial layer 130, the conversion efficiency of BPD to TED is improved, thereby enhancing epitaxial quality. On the other hand, gradual cooling during epitaxial growth of the SiC buffer layer 120 can improve the conversion efficiency of BPD to TED during epitaxial growth and reduce the probability of other defect formation.

In some embodiments, the working temperature Tw decreases linearly, meaning that the working temperature Tw has a linear relationship with the working time (i.e., the total time for forming the SiC buffer layer 120). This reduces the probability of other defect formation due to sudden drops in the working temperature Tw, further improving the subsequent epitaxial quality. In some embodiments, the working temperature Tw decreases at a rate of 0.1° C./second to 0.4° C./second, and the gradual cooling method ensures stable crystal growth, enhancing the conversion efficiency of BPD to TED. In some embodiments, the working temperature Tw continues to decrease but does not fall below the epitaxial temperature Te used subsequently for forming the epitaxial layer 130. For example, when the epitaxial temperature Te used for forming the epitaxial layer 130 is between 1550° C. and 1650° C., the working temperature Tw for forming the SiC buffer layer 120 can continue to decrease to greater than or equal to 1550° C. to 1650° C. (e.g., greater than or equal to 1550° C., greater than or equal to 1600° C., greater than or equal to 1650° C.) during the formation of the SiC buffer layer 120.

In some embodiments, during the formation of the SiC buffer layer 120 (i.e., during step S30), the epitaxial quality can be further improved by adjusting the C/Si Ratio in the growth source. Specifically, during the formation of the SiC buffer layer 120, the supply concentration of the carbon source can be gradually increased while correspondingly decreasing the supply concentration of the silicon source, thereby gradually increasing the overall C/Si Ratio in the growth source. As a result, the later-formed and higher-level SiC buffer layers (e.g., the nth SiC buffer layer 120n) have a higher C/Si Ratio, thereby promoting lateral growth at the top position of the SiC buffer layer 120 and inhibiting step flow growth at the top position of the SiC buffer layer 120, thus increasing the conversion efficiency of BPD to TED during the subsequent formation of the epitaxial layer 130. In some embodiments, the C/Si Ratio in the growth source for forming the SiC buffer layer 120 continues to increase but does not exceed the C/Si Ratio in the growth source for subsequently forming the epitaxial layer 130. For example, when the C/Si Ratio in the growth source for forming the epitaxial layer 130 is at least 1.3, the C/Si Ratio in the growth source for forming the SiC buffer layer 120 can continue to increase to less than or equal to 1.3. Additionally, it should be noted that the C/Si Ratio in the growth source disclosed herein is measured at the inlet of the reaction chamber.

In some embodiments, the C/Si Ratio in the growth source gradually increases. This helps to gradually increase the C/Si Ratio of the SiC buffer layer 120, further enhancing the epitaxial quality. In some embodiments, by gradually increasing the C/Si Ratio in the growth source, stable crystal growth is promoted, defect formation is reduced, thereby increasing the conversion efficiency of BPD to TED.

In some embodiments, during the formation of the SiC buffer layer 120 (i.e., during the step S30), the quality of epitaxial growth can be further enhanced by adjusting the concentration of the dopant source. Specifically, during the formation of the SiC buffer layer 120, the concentration of the dopant source can be gradually decreased. This allows for the use of a high concentration of dopants in the early stages of SiC buffer layer 120 formation to suppress two-dimensional island nucleation, effectively preventing the formation of unintended 3C—SiC crystal structures. This also allows for the use of a low concentration of dopants in the later stages of SiC buffer layer 120 formation to reduce the probability of generating large defects (such as triangular defects and carrot defects). In some embodiments, the concentration of the dopant source can be gradually decreased from 5E18 atoms/cm$^3$ to 3E17 atoms/cm$^3$. In some embodiments, the concentration of the dopant source for forming the SiC buffer layer 120 is lower than the concentration of the dopant source for forming the SiC substrate 110 and higher than the concentration of the dopant source for forming the epitaxial layer 130. For example, the concentration of the dopant source for forming the silicon carbide substrate 110 can be about 1E19 atoms/cm$^3$, and the concentration of the dopant source for forming the epitaxial layer 130 can be 2E15 atoms/cm$^3$ to 2E16 atoms/cm$^3$. It should be noted that the concentration of the dopant source is measured at the inlet of the reaction chamber.

Overall, during step S30, the pressure in the reaction chamber is maintained at 100 millibars (mbar) to 200 mbar. The flow rate of the carbon source in the growth source ranges from 300 standard cubic centimeters per minute (sccm) to 600 sccm, the flow rate of the silicon source ranges from 300 sccm to 500 sccm, and the flow rate of the dopant source ranges from 200 sccm to 500 sccm. The overall epitaxial growth time is 1 minute to 5 minutes. Upon completion of step S30, the SiC buffer layer 120 on the SiC substrate 110 can be obtained.

Next, growth source and dopant source are continuously introduced at the epitaxial temperature Te to continue epitaxial growth on the SiC buffer layer 120 to form the epitaxial layer 130. The epitaxial temperature Te for forming the epitaxial layer 130 is lower than or equal to the working temperature Tw for forming the SiC buffer layer 120, and the C/Si ratio in the growth source for forming the epitaxial layer 130 is greater than or equal to the C/Si ratio in the growth source for forming the SiC buffer layer 120. Overall, by controlling the working temperature Tw, the C/Si ratio in the growth source, and the concentration of the dopant source in a gradient (gradual) manner during the formation of the SiC buffer layer 120, the quality of the epitaxial layer 130 can be effectively improved.

Please return to the FIG. 1. After the formation of the epitaxial layer 130, the semiconductor structure 100 as shown in FIG. 1 can be obtained. Based on the gradient (gradual) working temperature Tw and the gradient C/Si ratio used during the formation of the SiC buffer layer 120, the C/Si ratio of the SiC buffer layer 120 increases along the direction D (i.e., the direction of the stacking thickness of the SiC buffer layer 120) from the SiC substrate 110 to the epitaxial layer 130. In some embodiments, the C/Si ratio of the SiC buffer layer 120 is lower than the C/Si ratio of the epitaxial layer 130. Specifically, the C/Si ratio of the epitaxial layer 130 can be, for example, 1.3, the C/Si ratio of the SiC buffer layer 120 can be, for example, 0.9 to 1.1, and the C/Si ratio of the SiC buffer layer 120 increases gradually from the SiC substrate 110 to the epitaxial layer 130. It should be understood that the C/Si ratio of the SiC buffer layer 120 is measured through a destructive analysis using secondary ion mass spectrometry (SIMS).

Furthermore, based on the gradient working temperature Tw used during the formation of the SiC buffer layer 120, the surface roughness of the SiC buffer layer 120 decreases along the direction D from the SiC substrate 110 to the epitaxial layer 130. Specifically, as the epitaxial temperature decreases, the surface roughness of the SiC buffer layer 120 formed decreases. Therefore, the surface roughness at the top position of the SiC buffer layer 120 is smaller than the surface roughness at its bottom position. Specifically, as shown in the FIG. 1, the surface roughness at position B of the SiC buffer layer 120 is smaller than the surface roughness at position A. The "surface roughness" disclosed herein specifically refers to the "centerline average roughness," which is measured/observed using atomic force microscopy (AFM) in conjunction with a destructive analysis using secondary ion mass spectrometry.

On the other hand, based on the gradient concentration of the dopant source used during the formation of the SiC buffer layer 120, the dopant concentration of the SiC buffer layer 120 decreases along the direction D from the SiC substrate 110 to the epitaxial layer 130. In some embodiments, the dopant concentration of the SiC buffer layer 120 is lower than the dopant concentration of the SiC substrate 110 and higher than the dopant concentration of the epitaxial layer 130. In some embodiments, the dopant concentration of the SiC buffer layer 120 is 3E17 atoms/cm$^3$ to 5E18 atoms/cm$^3$, and gradually decreasing from the SiC substrate 110 to the epitaxial layer 130. It should be understood that the dopant concentration of the SiC buffer layer 120 is measured through a destructive analysis using secondary ion mass spectrometry.

In some embodiments, a thickness H1 of the SiC buffer layer 120 can be 0.5 μm to 3.0 μm (e.g., 1.0 μm, 1.5 μm, 2.0 μm, 2.5 μm). Compared to the commonly used buffer layer thickness in this field, the SiC buffer layer 120 disclosed herein has a relatively larger thickness H1, which allows for more space to perform gradient (gradual) improvements, providing more opportunities for BPD conversion to TED during the formation of the SiC buffer layer 120. This, in turn, can improve the efficiency of BPD conversion to TED, reduce the probability of fatal defects formation, and improve the epitaxial quality. In some embodiments, a thickness H2 of the SiC substrate 110 is 300 µm to 400 µm (e.g., 350 µm), and a thickness H3 of the epitaxial layer is 5.5 µm to 30 µm (e.g., 10 µm, 15 µm, 20 µm, 25 µm).

Overall, by forming a first SiC buffer layer 120*a* on the SiC substrate 110 at a first temperature and forming a second SiC buffer layer 120*b* on the first SiC buffer layer 120*a* at a second temperature lower than the first temperature, the C/Si ratio of the second SiC buffer layer 120*b* can be greater than that of the first SiC buffer layer 120*a*. Additionally, gradually increasing the C/Si ratio in the growth source during epitaxial growth can also contribute to increasing the C/Si ratio of the second SiC buffer layer 120*b* relative to the first SiC buffer layer 120*a*. Furthermore, by gradually cooling during epitaxial growth, the surface roughness of the second SiC buffer layer 120*b* can be smaller than the surface roughness of the first SiC buffer layer 120*a*. On the other hand, by gradually decreasing the concentration of the dopant source, the dopant concentration of the second SiC buffer layer 120*b* can be smaller than the dopant concentration of the first SiC buffer layer 120*a*. The above designs can improve the efficiency of BPD conversion to TED and reduce the probability of generating large defects, thereby improving epitaxial quality.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor structure, comprising:
   a silicon carbide substrate;
   a silicon carbide buffer layer disposed on the silicon carbide substrate; and
   an epitaxial layer disposed on the silicon carbide buffer layer, wherein a molar ratio of carbon to silicon atoms in the silicon carbide buffer layer gradually increases along a direction from the silicon carbide substrate to the epitaxial layer.

2. The semiconductor structure of claim 1, wherein a doping concentration of the silicon carbide buffer layer gradually decreases along a direction from the silicon carbide substrate to the epitaxial layer.

3. The semiconductor structure of claim 1, wherein a centerline average roughness of the silicon carbide buffer layer gradually decreases along a direction from the silicon carbide substrate to the epitaxial layer.

4. The semiconductor structure of claim 1, wherein a thickness of the silicon carbide buffer layer is 0.5 µm to 3.0 µm.

* * * * *